(12) United States Patent
Sharf

(10) Patent No.: US 11,088,715 B2
(45) Date of Patent: Aug. 10, 2021

(54) COMMUNICATION SYSTEM HAVING A RECEPTACLE CAGE WITH AN AIRFLOW CHANNEL

(71) Applicant: TE CONNECTIVITY CORPORATION, Berwyn, PA (US)

(72) Inventor: Alex Michael Sharf, Harrisburg, PA (US)

(73) Assignee: TE CONNECTIVITY SERVICES GmbH, Schaffhausen (CH)

(*) Notice: Subject to any disclaimer, the term of this patent is extended or adjusted under 35 U.S.C. 154(b) by 0 days.

(21) Appl. No.: 16/118,755

(22) Filed: Aug. 31, 2018

(65) Prior Publication Data
US 2020/0076455 A1    Mar. 5, 2020

(51) Int. Cl.
| H04B 1/036 | (2006.01) |
| H05K 7/20 | (2006.01) |
| G02B 6/42 | (2006.01) |
| H05K 1/02 | (2006.01) |

(52) U.S. Cl.
CPC ........... *H04B 1/036* (2013.01); *G02B 6/4269* (2013.01); *G02B 6/4277* (2013.01); *G02B 6/4284* (2013.01); *H05K 1/0203* (2013.01); *H05K 7/20127* (2013.01)

(58) Field of Classification Search
CPC .............................. H04B 1/036; H05K 7/20127
USPC ........................................................ 361/690
See application file for complete search history.

(56) References Cited

U.S. PATENT DOCUMENTS

| 6,866,544 | B1 * | 3/2005 | Casey ................. | H05K 9/0058 439/607.2 |
| 6,924,986 | B1 * | 8/2005 | Sardella .............. | H05K 7/1429 361/785 |
| 8,339,784 | B2 * | 12/2012 | Pirillis ............... | H01R 13/6586 361/679.5 |
| 8,534,930 | B1 * | 9/2013 | Lima ................... | G02B 6/4284 385/92 |
| 8,727,793 | B2 | 5/2014 | Cafiero et al. | |
| 8,890,004 | B2 * | 11/2014 | Wickes ................ | H05K 9/0009 174/354 |
| 9,042,096 | B2 * | 5/2015 | Thomas ............... | H04L 1/00 361/688 |
| 9,389,368 | B1 * | 7/2016 | Sharf .................. | H01R 27/00 |
| 9,484,678 | B1 * | 11/2016 | Briant ................. | H01R 13/659 |
| 2007/0223208 | A1 * | 9/2007 | Tanaka ................ | H05K 7/12 361/807 |
| 2011/0053415 | A1 * | 3/2011 | Fonteneau .......... | H05K 9/0058 439/607.01 |

(Continued)

*Primary Examiner* — Stephen S Sul

(57) ABSTRACT

A communication system having a circuit board with an airflow opening includes a receptacle cage configured to be mounted to the circuit board adjacent a communication connector. The receptacle cage has walls including a front wall, a rear wall and sidewalls defining a cavity. A module channel is defined in the cavity configured to receive a pluggable module. The module channel has a module port at the front wall that receives the pluggable module. An airflow channel is defined by at least one of the walls of the receptacle cage located between the module channel and the circuit board. The airflow channel is configured to be in flow communication with the airflow opening in the circuit board for cooling the pluggable module in the module channel. The airflow channel has an airflow port at the front wall.

20 Claims, 6 Drawing Sheets

(56) References Cited

U.S. PATENT DOCUMENTS

| | | | |
|---|---|---|---|
| 2012/0099275 A1* | 4/2012 | Regnier | H05K 7/20145 361/690 |
| 2012/0257355 A1* | 10/2012 | Yi | G02B 6/4269 361/704 |
| 2013/0210269 A1* | 8/2013 | Neer | G02B 6/4246 439/487 |
| 2015/0163898 A1* | 6/2015 | Mokhtarzad | H05K 1/0272 361/689 |
| 2015/0249308 A1* | 9/2015 | Recce | H01R 13/641 439/490 |
| 2016/0149324 A1* | 5/2016 | Regnier | H01R 12/721 439/76.1 |
| 2016/0211620 A1* | 7/2016 | Sharf | H01R 12/724 |
| 2017/0164518 A1* | 6/2017 | Morgan | G06F 1/181 |

* cited by examiner

COMMUNICATION SYSTEM HAVING A RECEPTACLE CAGE WITH AN AIRFLOW CHANNEL

BACKGROUND OF THE INVENTION

The subject matter herein relates generally to communication systems.

Some communication systems utilize communication connectors to interconnect various components of the system for data communication. Some known communication systems use pluggable modules, such as I/O modules, that are electrically connected to the communication connector. Conventional communication systems have performance problems, particularly when transmitting at high data rates. Known communication systems provide electrical shielding, such as in the form of a receptacle cage surrounding the communication connector and the pluggable module to provide electrical shielding. However, at high data rates, the pluggable modules generate significant heat. Heat dissipation in conventional communication systems is problematic, particularly for lower pluggable modules in systems having stacked arrangements because there is little room for heat sinks or other heat dissipating elements for the lower pluggable modules.

A need remains for a communication system having efficient heat dissipation.

BRIEF DESCRIPTION OF THE INVENTION

In one embodiment, a communication system having a circuit board with an airflow opening is provided including a receptacle cage configured to be mounted to the circuit board adjacent a communication connector. The receptacle cage has walls including a front wall, a rear wall and sidewalls defining a cavity. A module channel is defined in the cavity configured to receive a pluggable module. The module channel has a module port at the front wall that receives the pluggable module. An airflow channel is defined by at least one of the walls of the receptacle cage located between the module channel and the circuit board. The airflow channel is configured to be in flow communication with the airflow opening in the circuit board for cooling the pluggable module in the module channel. The airflow channel has an airflow port at the front wall.

In another embodiment, a communication system having a circuit board with an airflow opening is provided including a receptacle cage configured to be mounted to the circuit board adjacent a communication connector. The receptacle cage has walls including a top wall, a front wall, a rear wall and sidewalls defining a cavity. An upper module channel is in the cavity configured to receive an upper pluggable module and having an upper module port at the front wall that receives the upper pluggable module. A lower module channel is in the cavity configured to receive a lower pluggable module and having a lower module port at the front wall that receives the lower pluggable module. An airflow channel is defined by at least one of the walls of the receptacle cage. The airflow channel is located below the lower module channel. The airflow channel is configured to be in flow communication with the airflow opening in the circuit board for cooling the lower pluggable module in the lower module channel. The airflow channel has an airflow port at the front wall.

In a further embodiment, a communication system is provided including a circuit board having a cage mounting area and a connector mounting area. The circuit board has an airflow opening within the cage mounting area. A communication connector is mounted to the connector mounting area of the circuit board. The communication connector has a mating interface for mating with a pluggable module. A receptacle cage is mounted to the cage mounting area of the circuit board. The receptacle cage has walls including a front wall, a rear wall and sidewalls defining a cavity. The cavity has a module channel configured to receive the pluggable module and having a module port at the front wall that receives the pluggable module. The receptacle cage defines an airflow channel located between the module channel and the circuit board. The airflow channel is in flow communication with the airflow opening in the circuit board for cooling the pluggable module in the module channel.

DETAILED DESCRIPTION OF THE INVENTION

Figure 1:
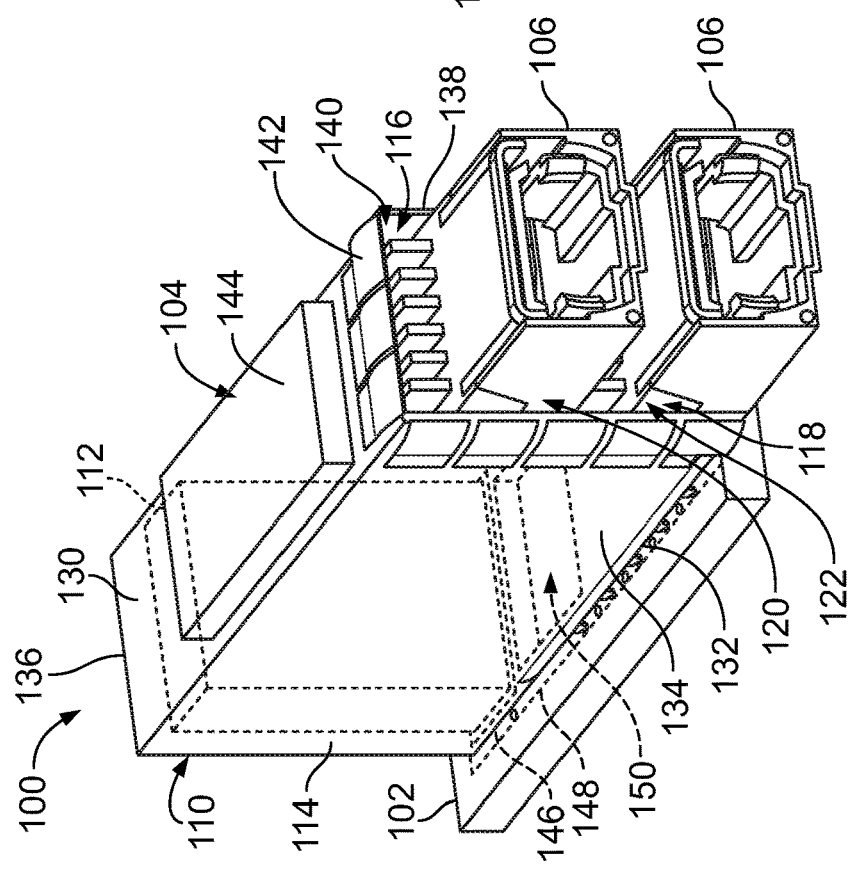
FIG. 1 is a front perspective view of communication system including a receptacle connector assembly in accordance with an exemplary embodiment.

FIG. 1 is a front perspective view of communication system 100 formed in accordance with an exemplary embodiment. The communication system includes a circuit board 102 and a receptacle connector assembly 104 mounted to the circuit board 102. Pluggable modules 106 are configured to be electrically connected to the receptacle connector assembly 104. The pluggable modules 106 are electrically connected to the circuit board 102 through the receptacle connector assembly 104.

In an exemplary embodiment, the receptacle connector assembly 104 includes a receptacle cage 110 and a communication connector 112 adjacent the receptacle cage 110. For example, in the illustrated embodiment, the communication connector 112 is received in the receptacle cage 110. In other various embodiments, the communication connector 112 may be located rearward of the receptacle cage 110. In various embodiments, the receptacle cage 110 is enclosed and provides electrical shielding for the communication connector 112. The pluggable modules 106 are loaded into the receptacle cage 110 and are at least partially surrounded by the receptacle cage 110. The receptacle cage 110 includes a plurality of walls 114 that define one or more module channels for receipt of corresponding pluggable modules 106. The walls 114 may be walls defined by solid sheets, perforated walls t allow airflow therethrough, walls with cutouts, such as for a heatsink or heat spreader to pass therethrough, or walls defined by rails or beams with relatively large openings, such as for airflow therethrough. In an exemplary embodiment, the receptacle cage 110 is a shielding, stamped and formed cage member with the walls 114 being shielding walls 114. In other embodiments, the receptacle cage 110 may be open between frame members, such as rails or beams, to provide cooling airflow for the pluggable modules 106 with the frame members of the receptacle cage 110 defining guide tracks for guiding loading of the pluggable modules 106 into the receptacle cage 110.

In the illustrated embodiment, the receptacle cage 110 constitutes a stacked cage member having an upper module channel 116 and a lower module channel 118. The receptacle cage 110 has upper and lower module ports 120, 122 that open to the module channels 116, 118 that receive the pluggable modules 106. Any number of module channels may be provided in various embodiments. In the illustrated embodiment, the receptacle cage 110 includes the upper and lower module channels 116, 118 arranged in a single column, however, the receptacle cage 110 may include multiple columns of ganged module channels 116, 118 in alternative embodiments (for example, 2×2, 3×2, 4×2, 4×3, etc.). The receptacle connector assembly 104 is configured to mate with the pluggable modules 106 in both stacked module channels 116, 118. Optionally, multiple communication connectors 104 may be arranged within the receptacle cage 110, such as when multiple columns of module channels 116, 118 are provided.

In an exemplary embodiment, the walls 114 of the receptacle cage 110 include a top wall 130, a bottom wall 132, and sidewalls 134 extending between the top wall 130 and the bottom wall 132. The bottom wall 132 may rest on the circuit board 102. However, in alternative embodiments, the bottom wall 132 may be elevated a distance above the circuit board 102 defining a gap below the bottom wall 132, such as for airflow. In other various embodiments, the receptacle cage 110 may be provided without the bottom wall 132. Optionally, the walls 114 of the receptacle cage 110 may include a rear wall 136 and a front wall 138 at the front of the receptacle cage 110. The module ports 120, 122 are provided in the front wall 138. The walls 114 define a cavity 140. For example, the cavity 140 may be defined by the top wall 130, the bottom wall 132, the sidewalls 134, the rear wall 136 and the front wall 138. Other walls 114 may separate or divide the cavity 140 into the various module channels 116, 118. For example, the walls 114 may include one or more divider walls between the upper and lower module channels 116, 118. In various embodiments, the walls 114 may include a separator panel between the upper and lower module channels 116, 118. The separator panel may form a space between the upper and lower module channels 116, 118, such as for airflow, for a heat sink, for routing light pipes, or for other purposes. In other various embodiments, the walls 114 may include a separator panel at the bottom of the receptacle cage 110, such as between the lower module channel 118 and the circuit board 102 that defines an airflow channel to allow airflow below the lower module channel 118.

In an exemplary embodiment, the receptacle cage 110 may include one or more gaskets 142 at the front wall 138 for providing electrical shielding for the module channels 116, 118. For example, the gaskets 142 may be configured to electrically connect with the pluggable modules 106 received in the corresponding module channels 116, 118. The gaskets 142 may be provided at the module ports 120, 122.

In an exemplary embodiment, the receptacle connector assembly 104 may include one or more heat sinks 144 for dissipating heat from the pluggable modules 106. For example, the heat sink 144 may be coupled to the top wall 130 for engaging the upper pluggable module 106 received in the upper module channel 116. The heat sink 144 may extend through an opening in the top wall 130 to directly engage the pluggable module 106. Other types of heat sinks may be provided in alternative embodiments. Optionally, the receptacle connector assembly 104 may include one or more heat sinks for engaging the lower pluggable module 106 and the lower module channel 118. For example, the lower heat sink may be provided in the separator panel between the upper and lower module channels 116, 118. In other various embodiments, the lower heat sink may be provided below the lower module channel 118, such as between the lower module channel 118 and the circuit board 102 or in a separator panel between the lower module channel 118 and the circuit board 102.

In an exemplary embodiment, the communication connector 112 is received in the cavity 140, such as proximate to the rear wall 136. However, in alternative embodiments, the communication connector 112 may be located behind the rear wall 136 exterior of the receptacle cage 110 and extend into the cavity 140 to interface with the pluggable module(s) 106. In an exemplary embodiment, a single communication connector 112 is used to electrically connect with the pair of stacked pluggable modules 106 in the upper and lower module channels 116, 118. In alternative embodiments, the communication system 100 may include discrete, stacked communication connectors 112 (for example, an upper communication connector and a lower communication connector) for mating with the corresponding pluggable modules 106.

In an exemplary embodiment, the pluggable modules 106 are loaded through the front wall 138 to mate with the communication connector 112. The shielding walls 114 of the receptacle cage 110 provide electrical shielding around the communication connector 112 and the pluggable modules 106, such as around the mating interfaces between the communication connector 112 and the pluggable modules 106. The communication connector 112 may be coupled to the circuit board 102 at a connector mounting area 146 of the circuit board 102. In other various embodiments, the communication connector 112 may be a cable communication connector located in or proximate to the receptacle cage 110 for mating with the pluggable module 106. The receptacle cage 110 is mounted to the circuit board 102 at a cage mounting area 148. The cage mounting area 148 is defined by the footprint of the receptacle cage 110. For example, the cage mounting area 148 is defined by the front wall 138, the rear wall 136 and the sidewalls 134 extending therebetween. Optionally, the cage mounting area 148 may have a rectangular surface area, with the length defined between the front and the rear of the receptacle cage 110 and the width defined between the sides of the receptacle cage 110. The connector mounting area 146 is defined by the footprint of the communication connector 112, and is contained within the cage mounting area 148. In an exemplary embodiment, the connector mounting area 146 is within a cage mounting area 148 that receives the receptacle cage 110. Alternatively, the connector mounting area 146 may be rearward of the cage mounting area 148.

In an exemplary embodiment, the circuit board 102 includes an airflow opening 150 therethrough allowing airflow into or out of the receptacle cage 110. In an exemplary embodiment, the airflow opening 150 is contained within the cage mounting area 148 forward of the connector mounting area 146. In various embodiments, the airflow opening 150 may extend approximately the entire width of the receptacle cage 110. For example, the airflow opening 150 may have a width approximately equal to a width of the communication connector 112. In an exemplary embodiment, the airflow opening 150 is in flow communication with the lower pluggable module 106 and the lower module channel 118 for cooling the lower pluggable module 106. For example, an airflow channel may be provided below and/or around the lower pluggable module 106 allowing air to flow along one or more surfaces of the lower pluggable module 106 to dissipate heat from the lower pluggable module 106. Optionally, the airflow channel may be open at the front wall 138 to draw airflow through the receptacle cage 110 through the airflow opening 150 in the circuit board 102.

Figure 2:
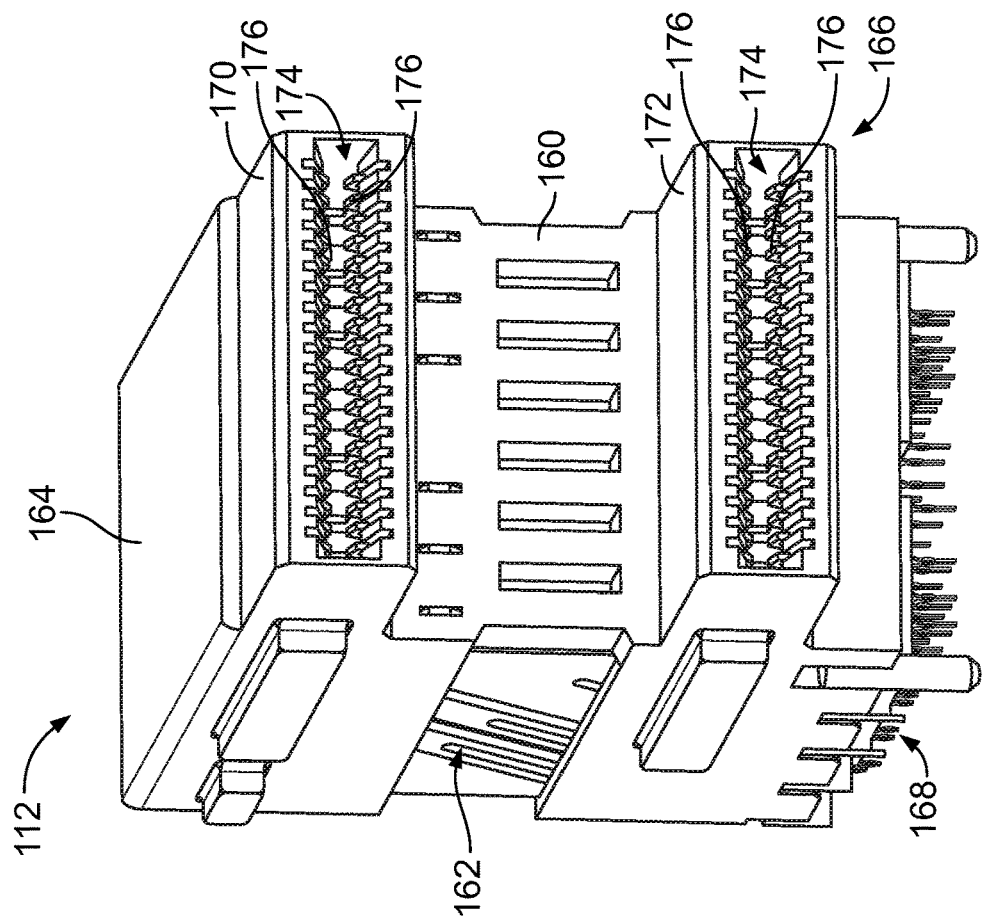
FIG. 2 is a front perspective view of a communication connector of the receptacle connector assembly in accordance with an exemplary embodiment.

FIG. 2 is a front perspective view of the communication connector 112 in accordance with an exemplary embodiment. The communication connector 112 includes a housing 160 holding a contact module stack 162. The contact module stack 162 is a stack of individual contact modules each having a plurality of contacts configured to be mounted to the circuit board 102. The housing 160 is defined by an upstanding body portion 164 having a mating end 166, such as at a front of the upstanding body portion 164. The body portion 164 may be molded from a dielectric material, such as a plastic material, to form the housing 160. The housing 160 may be open at the bottom or the rear to receive the contact module stack 162. In an alternative embodiment, rather than having a stack of contact modules, the housing 160 may hold individual contacts between the mating end 166 and a mounting end 168 configured to be mounted to the circuit board 102.

Upper and lower extension portions 170 and 172 extend from the body portion 164 to define a stepped mating face. For a single port cage member, the communication connector 112 may only include a single extension portion. Mating slots 174, such as circuit card receiving slots, are provided in each of the extension portions 170, 172 to receive mating components, such as plug connectors, card edges of circuit cards of the corresponding pluggable modules 106 (shown in FIG. 1), or another type of mating component. A plurality of contacts 176 are exposed within the mating slots 174 for mating with contact pads on the card edge of the corresponding pluggable module 106. The contacts 176 have tails that extend from the mounting end 168 for termination to the circuit board 102. For example, the tails of the contacts 176 may constitute pins that are received in plated vias of the circuit board 102. Alternatively, the tails of the contacts 176 may be terminated to the circuit board 102 in another manner, such as by surface mounting to the circuit board 102. The contact module stack 162 may include signal contact modules and ground contact modules or may include contact modules that have both signal contacts and ground contacts. The contact modules may be overmolded leadframes in various embodiments.

Figure 3:
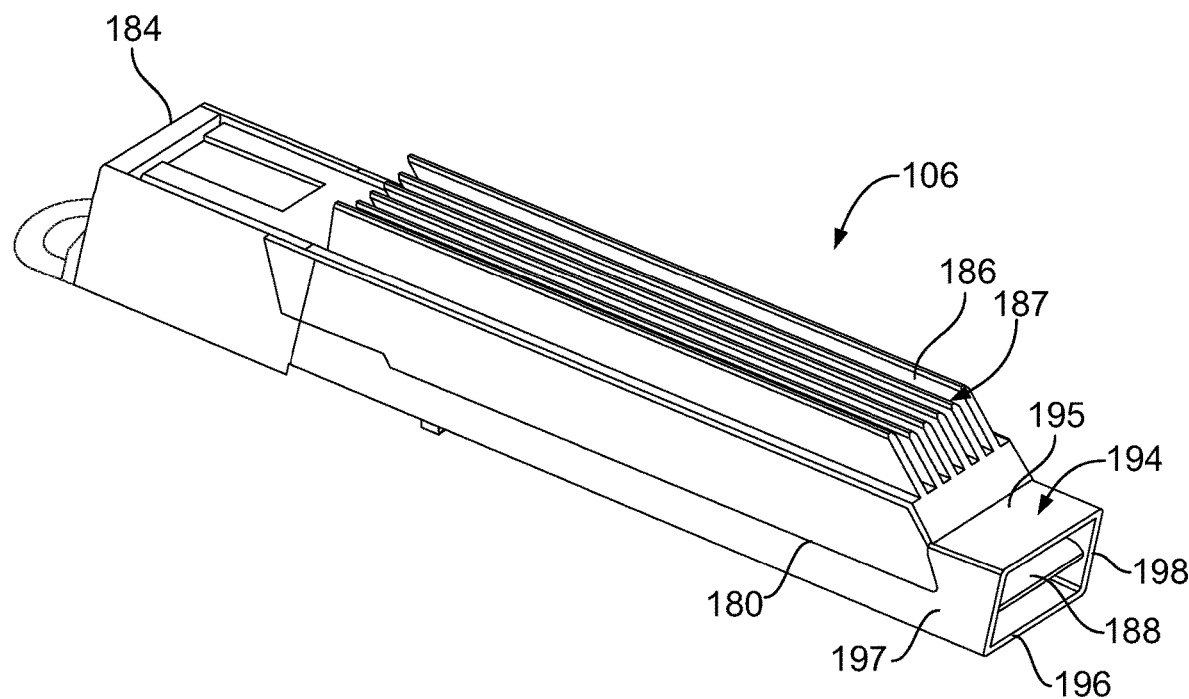
FIG. 3 is a rear perspective view of a pluggable module of the communication system in accordance with an exemplary embodiment.

FIG. 3 is a rear perspective view of the pluggable module 106 in accordance with an exemplary embodiment. The pluggable module 106 has a pluggable body 180, which may be defined by one or more shells. The pluggable body may be thermally conductive and/or may be electrically conductive, such as to provide EMI shielding for the pluggable module 106. The pluggable body 180 includes a mating end 182 and an opposite front end 184. The mating end 182 is configured to be inserted into the corresponding module channel 116 or 118 (shown in FIG. 1). The front end 184 may be a cable end having a cable extending therefrom to another component within the system.

The pluggable module 106 includes a module circuit board 188 that is configured to be communicatively coupled to the communication connector 112 (shown in FIG. 1). The module circuit board 188 may be accessible at the mating end 182. The module circuit board 188 may include components, circuits and the like used for operating and or using the pluggable module 106. For example, the module circuit board 188 may have conductors, traces, pads, electronics, sensors, controllers, switches, inputs, outputs, and the like associated with the module circuit board 188, which may be mounted to the module circuit board 188, to form various circuits.

The pluggable module 106 includes an outer perimeter defining an exterior 194 of the pluggable body 180. The exterior 194 extends between the mating end 182 and the front end 184 of the pluggable module 106. In an exemplary embodiment, the pluggable body 180 provides heat transfer for the module circuit board 188, such as for the electronic components on the module circuit board 188. For example, the module circuit board 188 is in thermal communication with the pluggable body 180 and the pluggable body 180 transfers heat from the module circuit board 188. In an exemplary embodiment, the pluggable body 180 includes a plurality of heat transfer fins 186 along at least a portion of the outer perimeter of the pluggable module 106. For example, in the illustrated embodiment, the fins 186 are provided along an end 195; however the fins 186 may additionally or alternatively be provided along the sides 197, 198 and/or the opposite end 196. The fins 186 transfer heat away from the main shell of the pluggable body 180, and thus from the module circuit board 188 and associated components. The fins 186 are separated by gaps 187 that allow airflow or other cooling flow along the surfaces of the fins 186 to dissipate the heat therefrom. In the illustrated embodiment, the fins 186 are parallel plates that extend lengthwise; however the fins 186 may have other shapes in alternative embodiments, such as cylindrical or other shaped posts.

Figure 4:
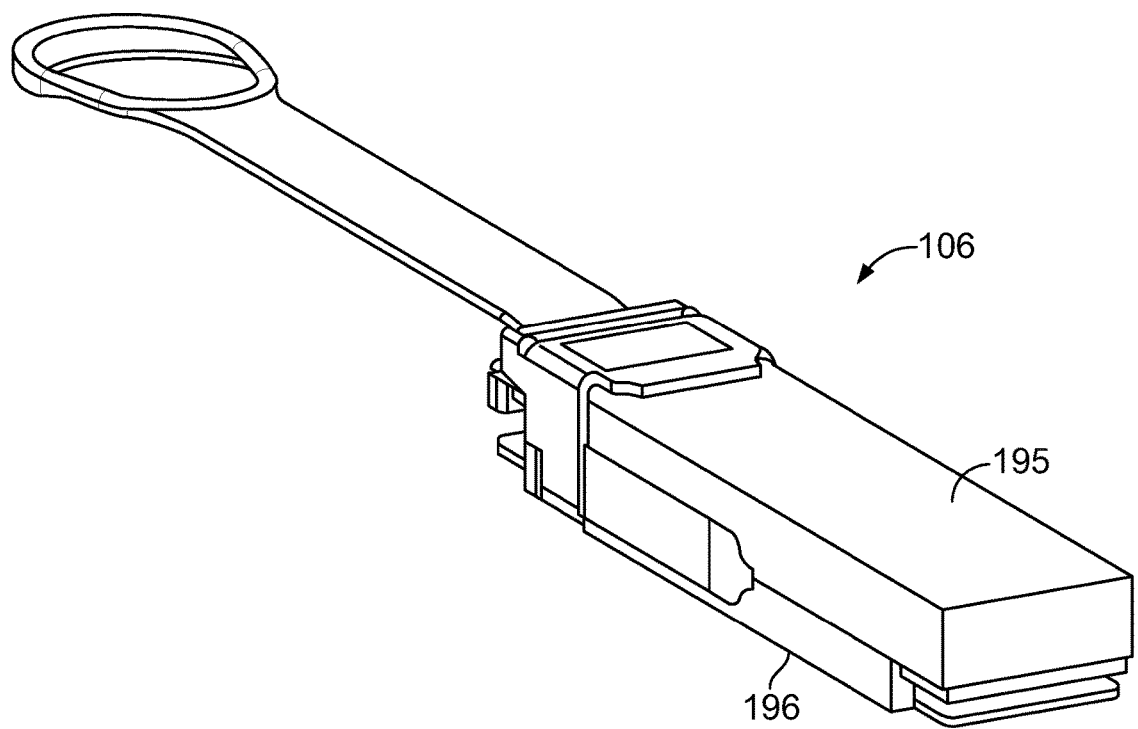
FIG. 4 is a rear perspective view of the pluggable module in accordance with an exemplary embodiment.

FIG. 4 is a rear perspective view of the pluggable module 106 in accordance with an exemplary embodiment. The pluggable module 106 illustrated in FIG. 4 does not include heat dissipating fins 186 on the pluggable body 180, but rather includes generally planar ends 195, 196, such as for interfacing with heat sinks or to provide a lower profile height compared to the pluggable module illustrated in FIG. 3.

Figure 5:
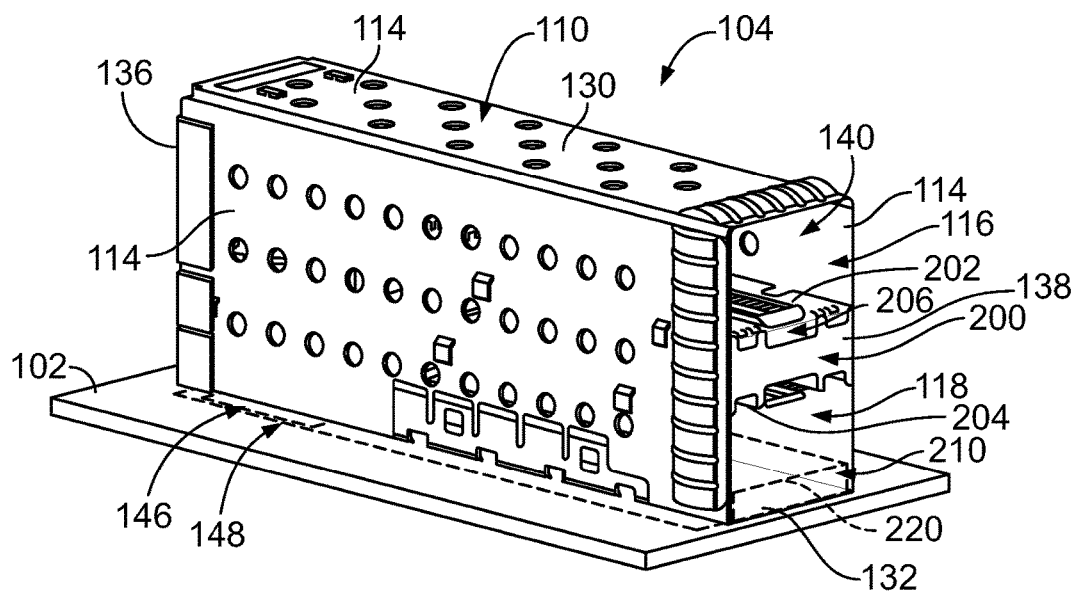
FIG. 5 is a front perspective view of a receptacle cage of the receptacle connector assembly in accordance with an exemplary embodiment.
Figure 6:
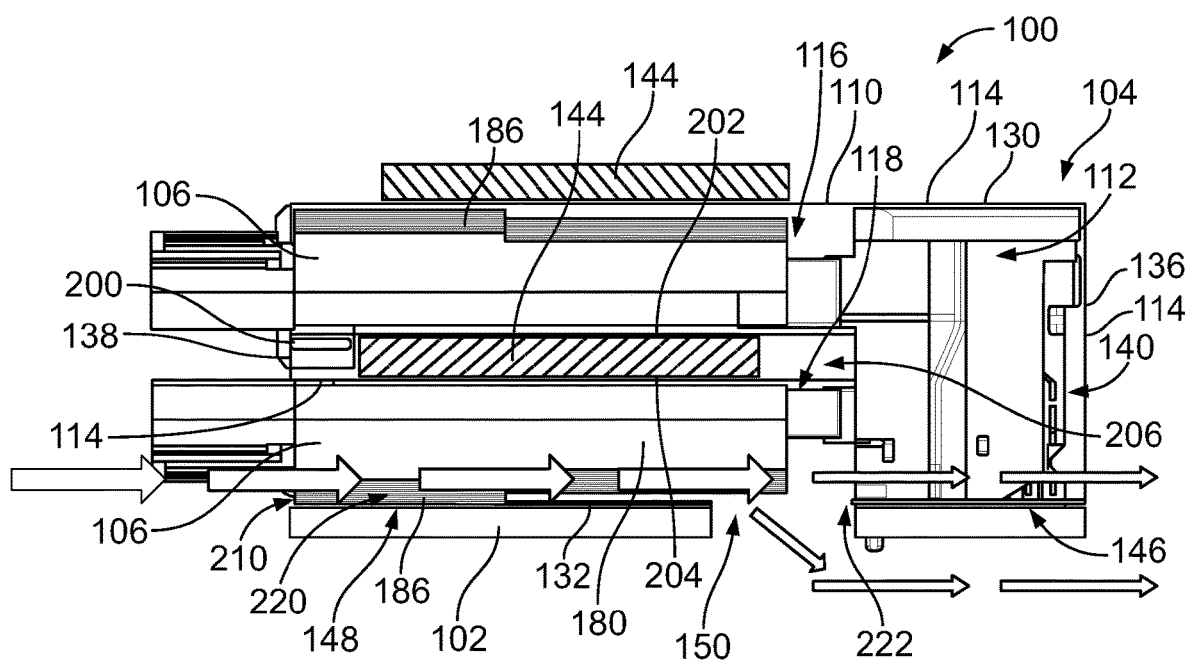
FIG. 6 is a partial sectional view of a portion of the communication system in accordance with an exemplary embodiment.

FIG. 5 is a front perspective view of the receptacle cage 110 of the receptacle connector assembly 104 in accordance with an exemplary embodiment showing the receptacle cage 110. FIG. 6 is a partial sectional view of a portion of the communication system 100 in accordance with an exemplary embodiment. FIG. 6 illustrates the receptacle cage 110 mounted to the circuit board 102 at the cage mounting area 148 above the airflow opening 150. The communication connector 112 is mounted to the circuit board 102 at the connector mounting area 146 in the cavity 140. The walls 114 of the receptacle cage 110 surround the communication connector 112.

In the illustrated embodiment, the receptacle cage 110 includes the separator panel 200 between the upper module channel 116 and the lower module channel 118. The separator panel 200 includes an upper wall 202 and a lower wall 204 separated from the upper wall 202 by a gap 206. The gap 206 may be a void allowing airflow between the upper module channel 116 and the lower module channel 118. In other various embodiments, the heat sink 144 may be received in the gap 206 to dissipate heat from the lower pluggable module 106 in the lower module channel 118. In the illustrated embodiment, the upper heat sink 144 is provided above the top wall 130 for dissipating heat from the upper pluggable module 106 and the upper module channel 116.

The airflow opening 150 promotes airflow through the bottom of the receptacle cage 110 for cooling the lower pluggable module 106 in the lower module channel 118. In an exemplary embodiment, the receptacle cage 110 has an airflow port 210 at the front wall 138. An airflow channel 220 is formed between the airflow port 210 and the airflow opening 150 for cooling the lower pluggable module 106. The airflow opening 150 promotes airflow through the airflow channel 220 by allowing a higher volume of airflow through the airflow channel 220. Optionally, some airflow may flow around the communication connector 112 rearward of the receptacle connector assembly 104, such as through the rear wall 136. However, with the addition of the airflow opening 150, a higher volume of airflow is able to flow past the lower pluggable module 106 and just relying on the airflow around the communication connector 112. In an exemplary embodiment, the airflow channel 220 is defined between the bottom wall 132 and the lower module channel 118. The bottom wall 132 provides electrical shielding below the lower module channel 118 and the airflow channel 220. In an exemplary embodiment, the bottom wall 132 includes an opening 222 aligned with the airflow opening 150 to allow airflow between the channel 220 and the opening 150. Optionally, rather than being a large cutout in the bottom wall 132, the bottom wall 132 may include a plurality of openings 222 in an array aligned with the airflow opening 150, such as many smaller circular openings above the airflow opening 150 to provide electrical shielding across the airflow opening 150. The airflow channel 220 extends from the airflow port 210 along the bottom wall 132 and the circuit board 102 to the airflow opening 150. As the air moves through the airflow channel 220, the air interacts with the lower pluggable module 106 to dissipate heat from the pluggable module 106.

In an exemplary embodiment, the lower pluggable module 106 is received in the lower module channel 118 such that the heat transfer fins 186 are located at the bottom of the lower pluggable module 106. The heat transfer fins 186 extend into the airflow channel 220 such that the airflows along the heat transfer fins 186 to dissipate heat from the lower pluggable module 106. The lower module channel 118 receives the pluggable body 180 and the airflow channel 220 receives the heat transfer fins 186. The lower pluggable module 106 is inverted relative to the upper pluggable module 106 and the upper module channel 116. For example, the upper pluggable module 106 has the heat transfer fins 186 extending upward toward the top wall 130 and the lower pluggable module 106 and the lower module channel 118 has the heat transfer fins 186 extending downward toward the bottom wall 132. Optionally, the heat transfer fins 186 may engage the bottom wall 132 to support the pluggable module 106 in the lower module channel 118.

Figure 7:
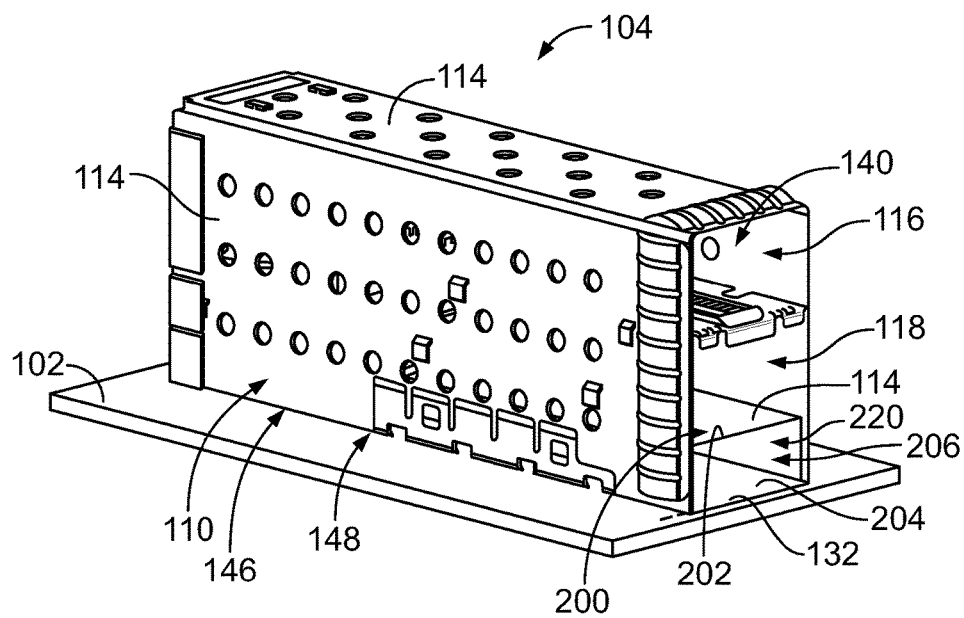
FIG. 7 is a front perspective view of a receptacle cage of the receptacle connector assembly in accordance with an exemplary embodiment.
Figure 8:
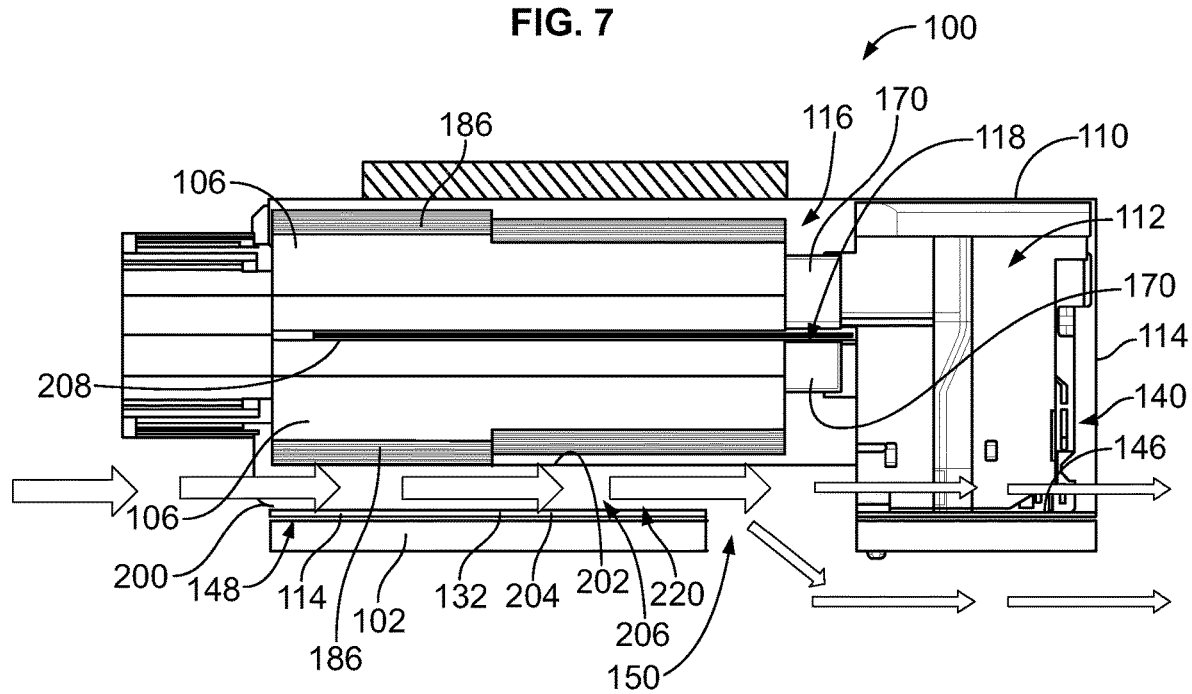
FIG. 8 is a partial sectional view of a portion of the communication system in accordance with an exemplary embodiment.

FIG. 7 is a front perspective view of the receptacle connector assembly 104 in accordance with an exemplary embodiment showing the receptacle cage 110. FIG. 8 is a partial sectional view of a portion of the communication system 100 in accordance with an exemplary embodiment. FIG. 8 illustrates the receptacle cage 110 mounted to the circuit board 102 at the cage mounting area 148 above the airflow opening 150. The communication connector 112 is mounted to the circuit board 102 at the connector mounting area 146 in the cavity 140. The walls 114 of the receptacle cage 110 surround the communication connector 112.

In the illustrated embodiment, the separator panel 200 is located below the lower module channel 118 as opposed to between the upper and lower module channels 116, 118. The upper module channel 116 is separated from the lower module channel 118 by a divider wall 208. The spacing between the upper and lower pluggable modules 106 is reduced by moving the separator panel 200 from between the pluggable modules 106 to below the lower pluggable module 106. The extension portions 170 of the communication connector 112 are arranged closer together in the illustrated embodiment to accommodate the tighter positioning of the pluggable modules 106.

The upper wall 202 of the separator panel 200 is located below the lower pluggable module 106 in the lower module channel 118. The lower wall 204 of the separator panel 200 is provided at the bottom of the receptacle cage 110. Optionally, the lower wall 204 may define the bottom wall 132 of the receptacle cage 110. The lower wall 204 of the separator panel 200 may rest on the circuit board 102. Optionally, the heat transfer fins 186 of the lower pluggable module 106 may be supported on the upper wall 202 of the separator panel 200.

The gap 206 of the separator panel 200 defines the airflow channel 220 allowing airflow below the lower module channel 118 to dissipate heat from the lower pluggable module 106. The gap 206 is a void in flow communication with the airflow opening 150. The gap 206 allows airflow through the separator panel 200 for cooling the lower pluggable module 106. The airflow opening 150 promotes and enhances airflow through the separator panel 200.

Figure 9:
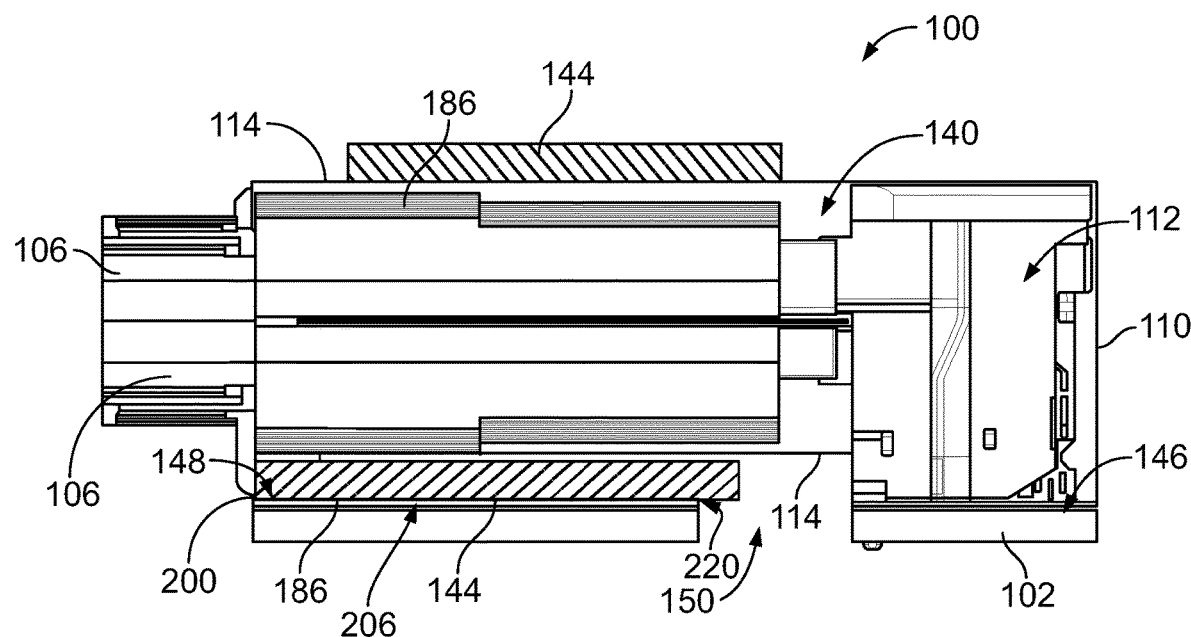
FIG. 9 is a partial sectional view of a portion of the communication system in accordance with an exemplary embodiment.

FIG. 9 is a partial sectional view of a portion of the communication system 100 in accordance with an exemplary embodiment. FIG. 9 illustrates the receptacle cage 110 mounted to the circuit board 102 at the cage mounting area 148 above the airflow opening 150. The communication connector 112 is mounted to the circuit board 102 at the connector mounting area 146 in the cavity 140. The walls 114 of the receptacle cage 110 surround the communication connector 112.

In the illustrated embodiment, the separator panel 200 is located below the lower pluggable module 106. A lower heat sink 144 is located in the gap 206 of the separator panel 200 below the lower pluggable module 106. The lower heat sink 144 is used to dissipate heat from the lower pluggable module 106, such as from the heat transfer fins 186. The lower heat sink 144 is provided in the airflow channels 220 and heat from the lower heat sink 144 may be dissipated through the airflow opening 150 in the circuit board 102.

Figure 10:
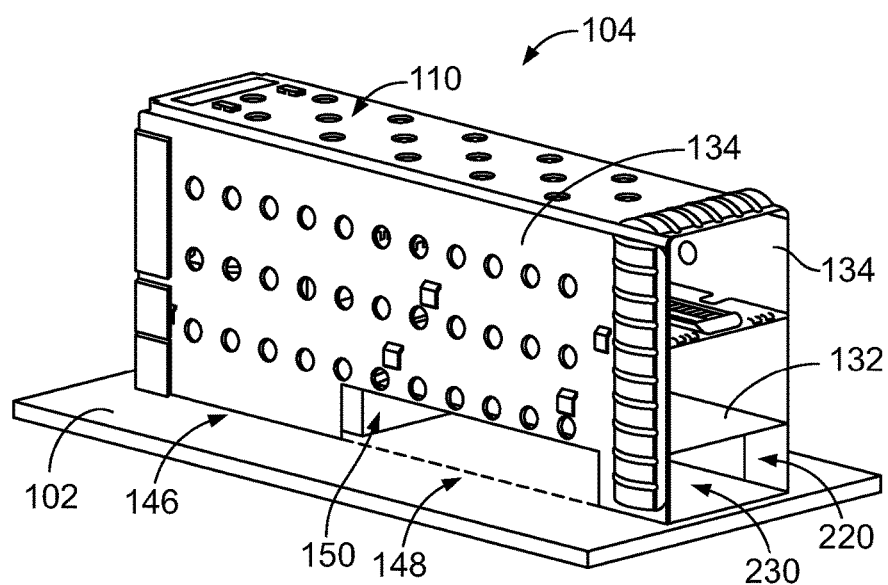
FIG. 10 is a front perspective view of a receptacle cage of the receptacle connector assembly in accordance with an exemplary embodiment.
Figure 11:
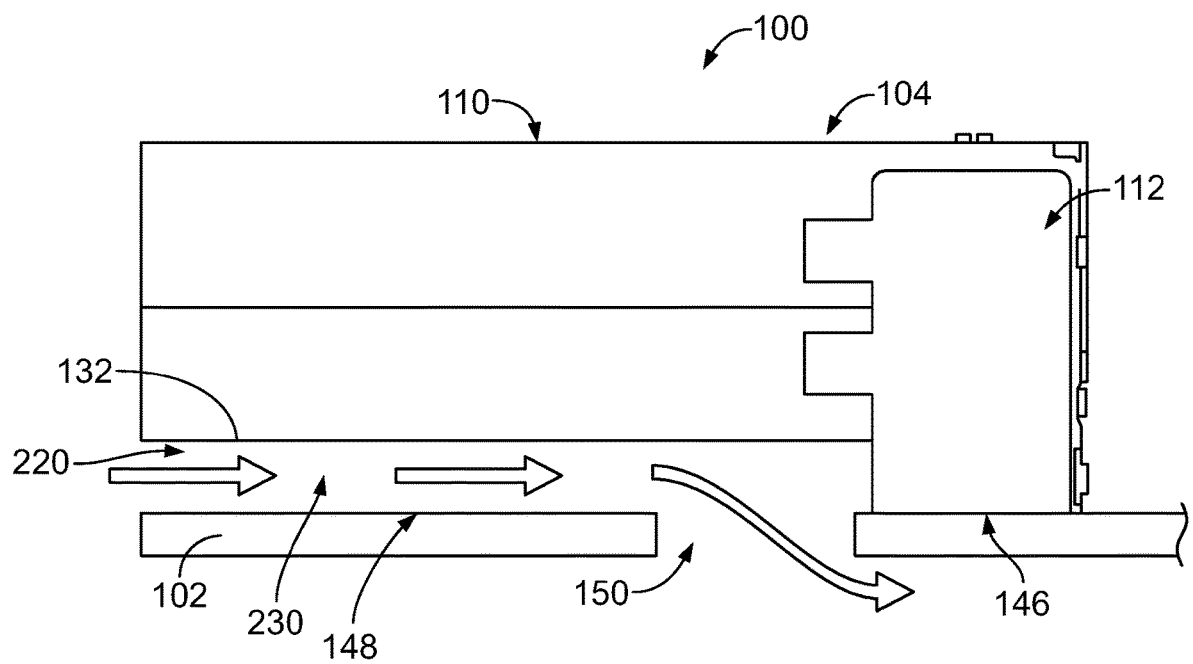
FIG. 11 is a partial sectional view of a portion of the communication system in accordance with an exemplary embodiment.

FIG. 10 is a front perspective view of the receptacle connector assembly 104 in accordance with an exemplary embodiment showing the receptacle cage 110. FIG. 11 is a partial sectional view of a portion of the communication system 100 in accordance with an exemplary embodiment. FIG. 11 illustrates the receptacle cage 110 mounted to the circuit board 102 at the cage mounting area 148 above the airflow opening 150. The communication connector 112 is mounted to the circuit board 102 at the connector mounting area 146.

In an exemplary embodiment, the bottom wall 132 of the receptacle cage 110 is elevated a distance above the top of the circuit board 102 forming a gap 230 between the bottom wall 132 and the circuit board 102. The gap 230 defines the airflow channel 220 and is in flow communication with the airflow opening 150. In various embodiments, the sidewalls 134 may extend to the circuit board 102 along the gap 230 to support the receptacle cage 110 but the bottom wall 132 is elevated a distance above the circuit board 102.

Figure 12:
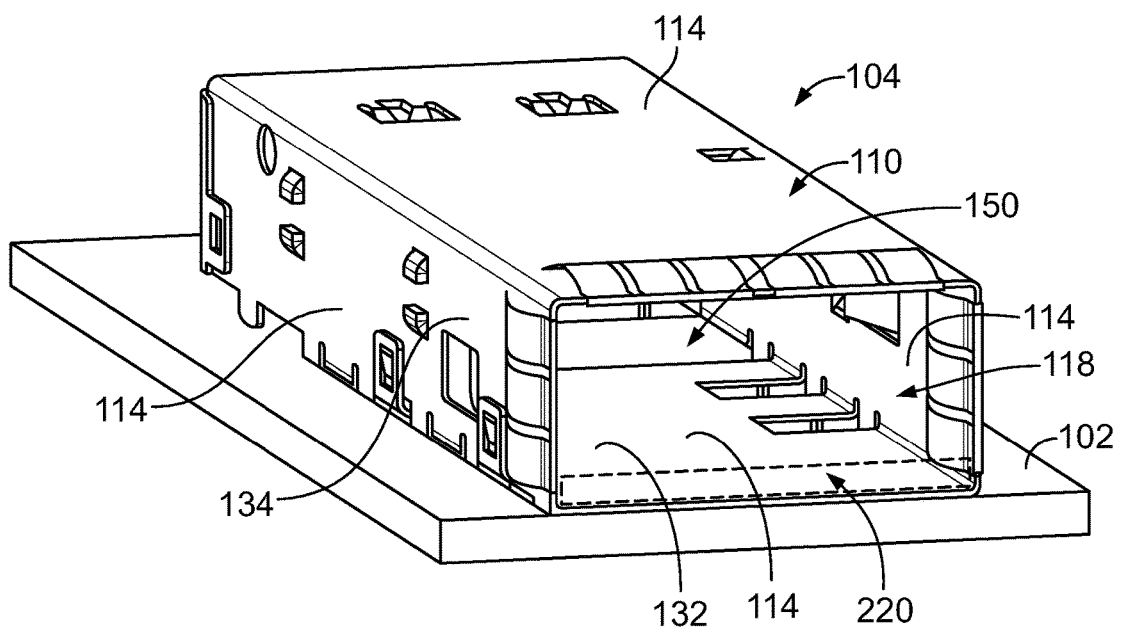
FIG. 12 is a front perspective view of a receptacle cage of the receptacle connector assembly in accordance with an exemplary embodiment.

FIG. 12 is a front perspective view of the receptacle cage 110 of the receptacle connector assembly 104 in accordance with an exemplary embodiment. FIG. 12 shows the receptacle connector assembly 104 as a single height or non-stacked embodiment. The receptacle connector assembly 104 includes the receptacle cage 110 defining the module channel 118 and the airflow channel 220. The airflow channel 220 is located between the module channel 118 and the circuit board 102. The airflow channel 220 is defined by at least one of the walls 114, such as the sidewalls 134 and the bottom wall 132. The airflow channel 220 may be defined by the separator panel 200 (shown in FIG. 5).

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A communication system for a circuit board with an airflow opening, the communication system comprising:
a receptacle cage having a bottom configured to be mounted to the circuit board adjacent a communication connector, the receptacle cage having walls including a front wall, a rear wall and sidewalls defining a cavity, the receptacle cage having a width between the sidewalls;
a module channel in the cavity configured to receive a pluggable module, the module channel having a module port at the front wall that receives the pluggable module;
an airflow channel defined by at least one of the walls of the receptacle cage located between the module channel and the circuit board, the airflow channel located at the bottom of the receptacle cage, the airflow channel being a single compartment that extends approximately the entire width of the receptacle cage between the sidewalls, the airflow channel being unobstructed forward of the airflow channel, the airflow channel configured to be in flow communication with the airflow opening in the circuit board for cooling the pluggable module in the module channel, the airflow channel having an airflow port at the front wall, wherein the airflow channel forms a void that is unobstructed by the pluggable module when the pluggable module is received in the module channel.

2. The communication system of claim 1, wherein the walls of the receptacle cage include a bottom wall, the bottom wall defining the airflow channel.

3. The communication system of claim 1, wherein the airflow channel is open to the module channel.

4. The communication system of claim 1, wherein the walls of the receptacle cage further comprises a separator panel located below the module channel, the separator panel defining the airflow channel.

5. The communication system of claim 1, wherein the walls of the receptacle cage include a bottom wall below and defining the module channel, the bottom wall configured to be elevated above the circuit board, the airflow channel being located below the bottom wall and defined by the bottom wall and the circuit board.

6. The communication system of claim 1, wherein the module channel is a lower module channel, the cavity including an upper module channel configured to receive an upper pluggable module.

7. The communication system of claim 1, further comprising the circuit board having a cage mounting area and the airflow opening within the cage mounting area, the receptacle cage being mounted to the circuit board at the cage mounting area, the airflow channel being in flow communication with the airflow opening.

8. The communication system of claim 1, wherein the airflow channel has an airflow channel width, the airflow channel width being at least as wide as the pluggable module.

9. A communication system for a circuit board with an airflow opening, the communication system comprising:
a receptacle cage having a bottom configured to be mounted to the circuit board adjacent a communication connector, the receptacle cage having walls including a front wall, a rear wall and sidewalls defining a cavity, the receptacle cage having a width between the sidewalls, the walls of the receptacle cage include a separator panel located below the module channel;
a module channel in the cavity configured to receive a pluggable module, the module channel having a module port at the front wall that receives the pluggable module;
an airflow channel defined by the separator panel, the airflow channel located at the bottom of the receptacle cage, the airflow channel extending approximately the entire width of the receptacle cage between the sidewalls, the airflow channel configured to be in flow communication with the airflow opening in the circuit board for cooling the pluggable module in the module channel, the airflow channel having an airflow port at the front wall, wherein the separator panel includes an upper wall extending along the module channel and a lower wall configured to extend along the circuit board, the upper wall being separated from the lower wall by a gap defining the airflow channel.

10. A communication system for a circuit board with an airflow opening, the communication system comprising:
a receptacle cage configured to be mounted to the circuit board adjacent a communication connector, the receptacle cage having walls including a top wall, a front wall, a rear wall and sidewalls defining a cavity, the receptacle cage having a width between the sidewalls;
an upper module channel in the cavity configured to receive an upper pluggable module, the upper module channel having an upper module port at the front wall that receives the upper pluggable module;
a lower module channel in the cavity configured to receive a lower pluggable module, the lower module channel having a lower module port at the front wall that receives the lower pluggable module;
an airflow channel defined by at least one of the walls of the receptacle cage, the airflow channel located below the lower module channel, the airflow channel being a single compartment that extends approximately the entire width of the receptacle cage between the sidewalls, the airflow channel being unobstructed forward of the airflow channel, the airflow channel configured to be in flow communication with the airflow opening in the circuit board for cooling the lower pluggable module in the lower module channel, the airflow channel having an airflow port at the front wall, wherein the airflow channel forms a void that is unobstructed by the pluggable module when the pluggable module is received in the module channel.

11. The communication system of claim 10, wherein the lower module channel is configured to receive the lower pluggable module inverted relative to the orientation of the upper pluggable module received in the upper module channel.

12. The communication system of claim 10, wherein the walls of the receptacle cage include a bottom wall, the bottom wall defining the airflow channel.

13. The communication system of claim 10, wherein the airflow channel is open to the module channel.

14. The communication system of claim 10, wherein the walls of the receptacle cage further comprises a separator panel located below the lower module channel, the separator panel defining the airflow channel.

15. The communication system of claim 14, wherein the separator panel holds the lower pluggable module a distance off of the circuit board allowing airflow through the airflow channel between the lower pluggable module and the circuit board.

16. The communication system of claim 10, further comprising the circuit board having a cage mounting area and the airflow opening within the cage mounting area, the receptacle cage being mounted to the circuit board at the cage mounting area, the airflow channel being in flow communication with the airflow opening.

17. The communication system of claim 10, wherein the airflow channel has an airflow channel width, the airflow channel width being at least as wide as the pluggable module.

18. A communication system comprising:
a circuit board having a cage mounting area and a connector mounting area, the circuit board having an airflow opening within the cage mounting area;
a communication connector located in the connector mounting area of the circuit board, the communication connector having a mating interface for mating with a pluggable module; and
a receptacle cage having a bottom mounted to the cage mounting area of the circuit board, the receptacle cage having walls including a front wall, a rear wall and sidewalls defining a cavity, the receptacle cage having a width between the sidewalls, the cavity having a module channel configured to receive the pluggable module, the module channel having a module port at the front wall that receives the pluggable module, the receptacle cage defining an airflow channel located between the module channel and the circuit board, the airflow channel located at the bottom of the receptacle cage, the airflow channel being a single compartment that extends approximately the entire width of the receptacle cage between the sidewalls, the airflow channel being unobstructed forward of the airflow channel, the airflow channel being in flow communication with the airflow opening in the circuit board for cooling the pluggable module in the module channel, wherein the airflow channel forms a void that is unobstructed by the pluggable module when the pluggable module is received in the module channel.

19. The communication system of claim 18, wherein the airflow opening has a width approximately equal to a width of the communication connector.

20. The communication system of claim 18, wherein the airflow channel has an airflow channel width, the airflow channel width being at least as wide as the pluggable module.

* * * * *